United States Patent
Kelley et al.

(10) Patent No.: US 6,233,287 B1
(45) Date of Patent: May 15, 2001

(54) METHOD AND APPARATUS FOR MIXING SIGNALS

(75) Inventors: Brian Todd Kelley, Delray Beach, FL (US); Luis Augusto Bonet, Southlake, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/825,984

(22) Filed: Apr. 4, 1997

(51) Int. Cl.[7] .............................. H03D 1/04; H03M 3/02
(52) U.S. Cl. ........................ 375/316; 341/61; 341/143
(58) Field of Search .................... 375/316, 247, 375/295, 350; 341/61, 143; 708/307, 313, 423

(56) References Cited

U.S. PATENT DOCUMENTS

| | | | |
|---|---|---|---|
| 4,757,390 | * | 7/1988 | Mehrgardt et al. ............ 386/34 |
| 4,870,661 | * | 9/1989 | Yamada et al. ............... 375/240 |
| 5,148,167 | * | 9/1992 | Ribner ........................ 341/143 |
| 5,349,385 | * | 9/1994 | Glenn ......................... 348/458 |
| 5,513,209 | * | 4/1996 | Holm .......................... 375/354 |
| 5,521,949 | * | 5/1996 | Huang et al. ................ 375/377 |
| 5,621,805 | * | 4/1997 | Loh et al. .................... 381/119 |
| 5,640,424 | * | 6/1997 | Banavong et al. ........... 375/316 |
| 5,641,629 | * | 6/1997 | Gibson et al. ................ 84/606 |
| 5,644,677 | * | 7/1997 | Park et al. .................... 704/207 |
| 5,712,635 | * | 1/1998 | Wilson et al. ............... 341/144 |
| 5,748,126 | * | 5/1998 | Ma et al. ..................... 341/143 |
| 5,754,601 | * | 5/1998 | Horng et al. ................ 375/350 |
| 5,757,867 | * | 5/1998 | Caufield et al. ............. 375/350 |
| 5,970,086 | * | 10/1999 | Epstein et al. ............... 375/219 |
| 6,084,916 | * | 7/2000 | Ott ............................... 375/259 |

* cited by examiner

*Primary Examiner*—Young T. Tse
(74) *Attorney, Agent, or Firm*—Philip P. Macnak; Eduardo Guntin (57) ABSTRACT

A mixer (200, 201) including a transformation circuit (210) is used for frequency converting a first digital signal (208), sampled at a first sampling rate and operating at a first frequency, to a second digital signal (214) operating at a desired frequency. The transformation circuit (210) is adapted to modify and filter the first digital signal (208) to eliminate unwanted frequencies in the first digital signal (208) and to alter the first sampling rate of the first digital signal (208) by a predetermined factor to generate a modified and filtered first digital signal (308) operating at a second sampling rate and the first frequency. The transformation circuit (210) is further adapted to mix the modified and filtered first digital signal (308) with a predetermined injection signal (312) to generate the second digital signal (214) operating at the desired frequency and the second sampling rate.

14 Claims, 4 Drawing Sheets

METHOD AND APPARATUS FOR MIXING SIGNALS

FIELD OF THE INVENTION

This invention relates in general to radio communication units, and particularly to radio communication units utilizing digital mixers.

BACKGROUND OF THE INVENTION

It has become common place to find receiver and transmitter circuits in a radio communication unit employing digital mixers instead of conventional analog mixers. Digital mixers perform substantially the same tasks as analog mixers. For example, for transmitter circuits, digital mixers can be used to up-convert a baseband signal to an IF (intermediate frequency) signal, where as for receiver circuits, digital mixers can be used to down-convert a high frequency signal to an IF signal. These are conventional operations of analog mixers. The rationale for changing to digital technology is based on the substantial benefits attained over analog technology in areas such as manufacture, quality, power consumption, and flexibility for redesign and control.

Figure 1:
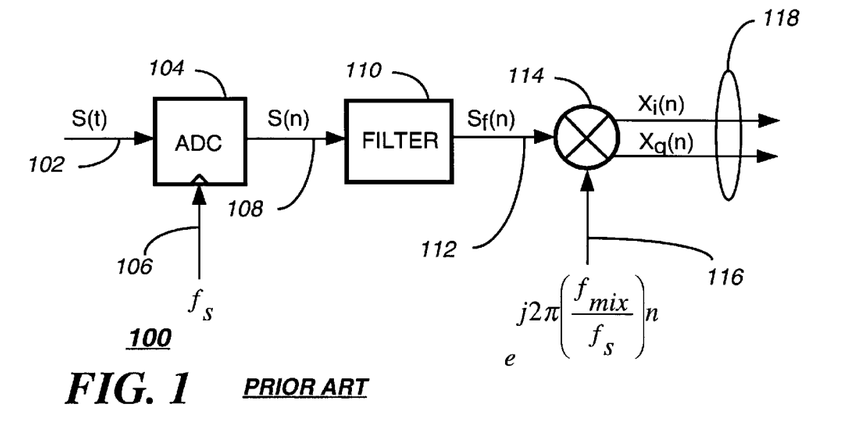
FIG. 1 is an electrical block diagram of a prior art digital mixer.

FIG. 1 illustrates a prior art structure for down-conversion digital mixers 100. The digital mixer 100 includes an ADC (analog-to-digital converter) 104, a digital filter 110 and a mixing element 114. Alternatively, an up-conversion digital mixer 100 is employed with an analog-to-digital converter at the output of the mixing element 114. A popular type of ADC is a sigma-delta converter. This type of ADC is popular because it allows for digital sampling of high frequency RF signals. Some structures have been known to sample RF signals operating at a carrier frequency of 600 MHz.

In order to perform the conversion of an analog signal 102 to a digital RF signal 108 operating at the same carrier frequency (e.g., $IF_1$), a sampling clock 106 is provided to the ADC 104. This sampling clock 106 is selected in accordance with the operational characteristics of the ADC 104. Independent of the carrier frequency of the input signal 102, the sampling clock 106 must operate at a fixed frequency, and cannot be arbitrarily varied. The inflexibility of varying the sampling clock 106 is a crucial limitation of prior art systems, for reasons that will become apparent shortly.

The digital filter 110 is generally used as an anti-aliasing filter as well as a pre-selection filter for filtering out unwanted frequencies in the digital signal 108. The filtered digital signal 112 generated therefrom is applied to the mixing element 114. The mixing element 114 is a digital mixer controlled by an injection signal 116 operating at a mixing frequency. The injection signal 116 conforms to the equation:

$$e^{j2\pi\left(\frac{f_{mix}}{f_s}\right)n}.$$

Mathematically, the mixing operation is simply the complex multiplication of the filtered digital signal 112 and the injection signal 116. Because digital multiplication operations consume a high amount of power, an undesirable factor in low-power consumer products, and because multiplication operations at high frequencies (e.g., 600 MHz) is not always achievable, the simplification of the injection signal equation is paramount. To eliminate the need for complex multiplication, prior art systems set the mixing frequency $f_{mix}$ to one-quarter the sampling frequency $f_s$. By doing this the injection signal can be simplified to the equation $(j)^n$. This equation results in a simplified periodic series of constants $(1,j,-1,-j,1,j,-1,-j,\ldots)$.

Utilizing a much simpler injection signal such as $(j)^n$ completely eliminates the need for a digital multiplier unit. Instead, a conventional digital logic can be used, which converts the digital values provided by the filtered digital signal 112 to complex in-phase and quadrature digital signals 118 without utilizing a digital multiplication circuit.

The elimination of high power consuming digital multipliers has proven to be a very effective means for utilizing digital mixers 100 in low power selective call units. However, the simplification method presented above, results in a significant constraint in the design of digital mixers. That is, this method provides for only one frequency conversion. Assuming the digital signal operates at an IF frequency $IF_1$, the frequency conversion to a new IF frequency $IF_2$ follows the equation:

$$IF_2 = IF_1 - \frac{f_s}{4}.$$

As should be apparent, the conversion process is limited to one mixing frequency (or injection frequency) $f_s/4$. Restricting, the mixing frequency $f_{mix}$ to a single injection frequency, eliminates the flexibility of mixing a digital signal to any arbitrary frequency (e.g., baseband). This is a severe limitation when contrasted to analogous analog mixers.

Thus, low-power prior art digital mixers, employing the above method, are substantially limited by the sampling frequency 106 used by the selected ADC 104. Accordingly, it is desirable to provide an improved digital mixer for selective call units that is capable of mixing digital signals at an arbitrary mixing frequency $f_{mix}$. Moreover, the improved digital mixer should be capable of performing either up or down frequency conversion.

DESCRIPTION OF THE PREFERRED EMBODIMENT

Figure 2:
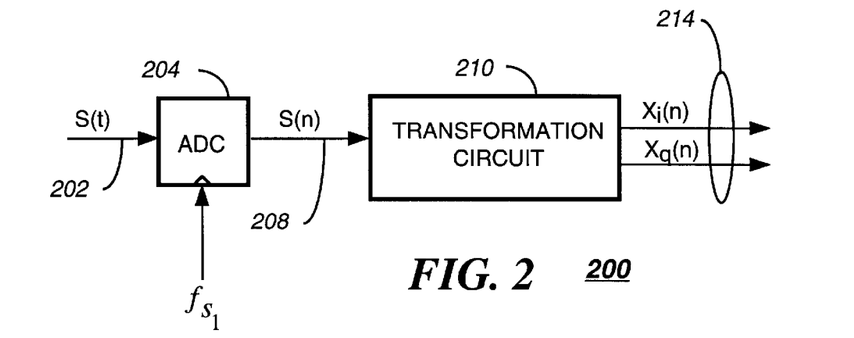
FIG. 2 is an electrical block diagram of a mixer according to the present invention.

FIG. 2 is an electrical block diagram of a mixer 200 according to the present invention. The mixer 200 comprises an ADC (analog-to-digital converter) 204 and a transformation circuit 210 coupled thereto.

The ADC 204 is preferably a conventional sigma-delta converter operating at a first sampling rate (denoted by the symbol $f_{s_1}$). Alternatively, other ADC's suitable to the present invention may be used. The ADC 204 receives an analog signal 202 (denoted by the symbol S(t)) operating at a first frequency and converts the analog signal 202 to a first digital signal 208 (denoted by the symbol S(n)) operating at the first frequency $f_1$ and the first sampling rate $f_{s_1}$.

The transformation circuit 210 is used for frequency converting the first digital signal 208, sampled at the first sampling rate and operating at the first frequency, to a second digital signal 214 operating at a desired frequency. To accomplish this task, the transformation circuit 210 is adapted to modify and filter the first digital signal 208 to eliminate unwanted frequencies in the first digital signal 208 and to alter the first sampling rate of the first digital signal 208 by a predetermined factor to generate a modified and filtered first digital signal operating at a second sampling rate and the first frequency. Subsequently, the transformation circuit 210 is adapted to mix the modified and filtered first digital signal with a predetermined injection signal to generate the second digital signal 214 operating at the desired frequency and the second sampling rate.

Figure 3:
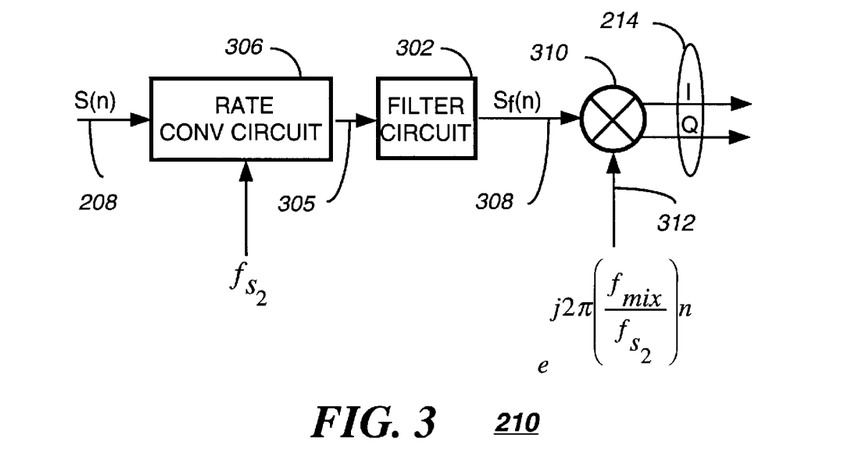
FIG. 3 is an electrical block diagram of a transformation circuit utilized by the mixer according to the present invention.
Figure 4:
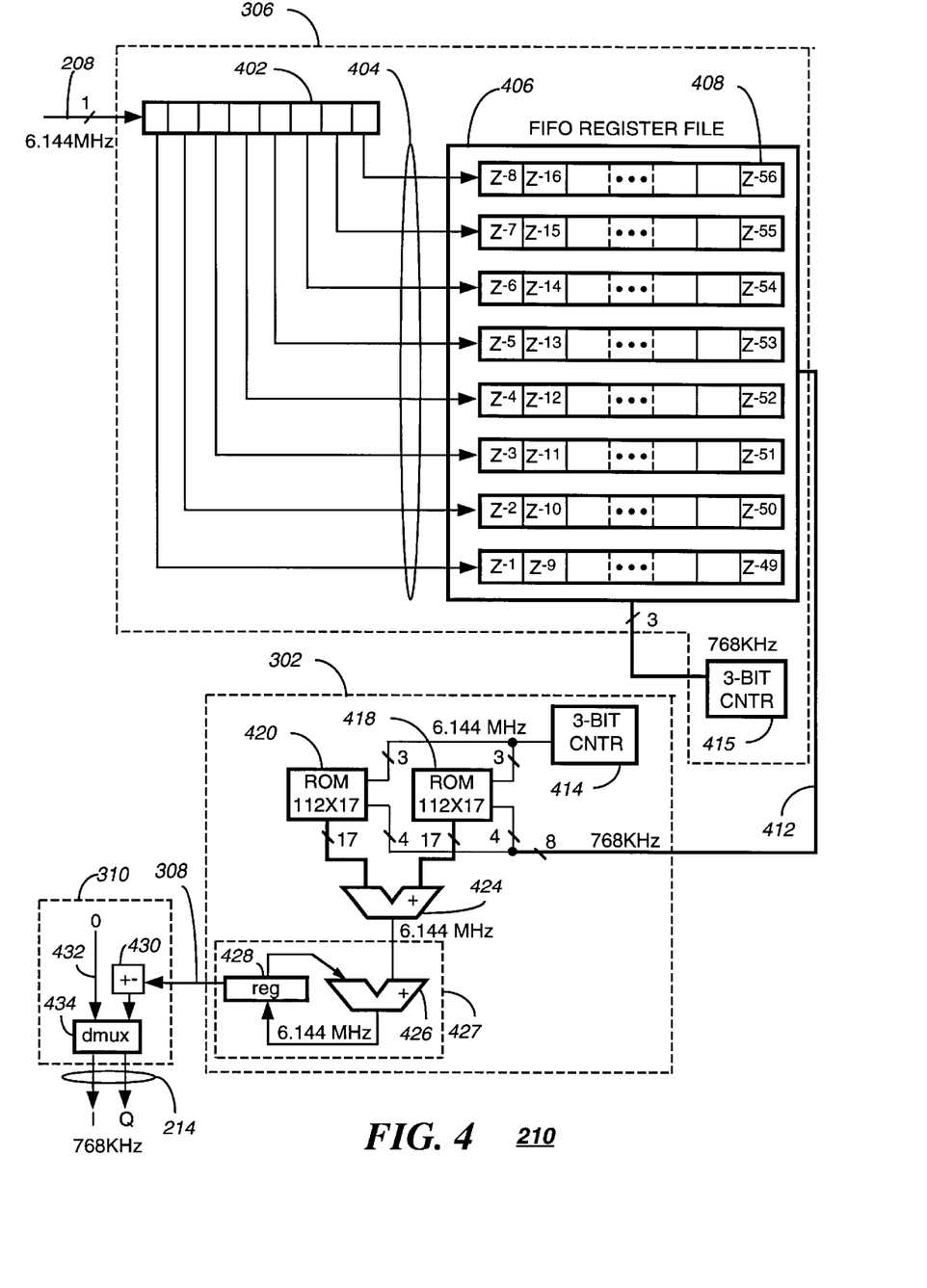
FIG. 4 is an electrical block diagram detailing the elements of the transformation circuit according to the present invention based on an illustration of a decimation factor set to ⅛.

These tasks shall be described in detail based on the embodiment shown in FIGS. 3 & 4. Although the invention shall be described in terms of a preferred embodiment it should be obvious to those skilled in the art that many alterations and variations may be employed without departing from the invention.

FIG. 3 is an electrical block diagram of the transformation circuit 210 utilized by the mixer 200 according to the present invention. The transformation circuit 210 comprises a rate conversion circuit 306, a filter circuit 302, and a digital mixer 310.

The filter circuit 302 is used as an anti-aliasing filter (and if necessary a pre-selection filter), and is preferably an FIR (finite impulse response) filter of N-taps conforming to the equation $$\sum_{k=0}^{N-1} h[k]\, S[((n-k))_N],$$

where h[k] is a predetermined impulse response function, and the product $h[k]\, S[((n-k))_N]$ represents a convolved sample of the rate conversion output signal 305. Since the convolution is circular, the argument for the function S(n−k) is evaluated modulo N. The rate conversion circuit 306 is preferably a decimator, which converts the first sampling rate of the first digital signal 208 S(n) by the predetermined factor U/V.

The filter circuit 302 along with the rate conversion circuit 306 modify and filter the first digital signal 208 to eliminate unwanted frequencies in the first digital signal 208, and to alter the first sampling rate by a predetermined factor to generate the modified and filtered first digital signal 308 (denoted by the symbol $S_f(n)$) operating at the second sampling rate (denoted by the symbol $f_{s_2}$).

The digital mixer is controlled by the injection signal 312, which follows the equation $$e^{j2\pi\left(\frac{f_{mix}}{f_{s_2}}\right)n}.$$

As with prior art systems, it is imperative to eliminate the process of multiplication from the digital mixer 310 for low power applications. This is accomplished by setting the mixing frequency $f_{mix}$ to one-quarter the sampling frequency $f_s$. By doing this the injection signal 312 is simplified to the equation $(j)^n$, which expands to the periodic series of constants 1,j,−1,−j, . . . By multiplying the modified and filtered first digital signal 308 with the injection signal 312, the second digital signal 214 operating at the second sampling rate and the desired frequency is generated.

A crucial "distinction" between prior art systems and the present invention is that by modifying the first sampling rate ($f_{s_1}$) of the first digital signal 208 to the second sampling rate ($f_{s_2}$), the mixing frequency ($f_{mix}$) may be arbitrarily selected to generate a second digital signal operating at an arbitrary desired frequency ($f_d$).

Prior art systems, as previously discussed, must utilize a mixing frequency dependent on the first sampling rate ($f_{s_1}$) of the ADC 204. Hence in prior art systems further frequency conversions and/or processing is required to generate a digital signal operating at a desired frequency (e.g., baseband). The present invention, in contrast, provides for a single frequency conversion process to any arbitrary frequency with the advantage of a multiplierless operation.

Table 1 below summarizes the conversion process in the present invention from the first digital signal 208 operating at the first frequency ($f_1$) and the first sampling rate ($f_{s_1}$) to the second digital signal 214 operating at an arbitrary desired frequency ($f_d$) and second sampling rate ($f_{s_2}$). Table 1 illustrates the frequency spectrum of the second digital signal 214 for upper and lower bands of positive and negative frequencies.

TABLE 1

| initial $f_1$ | Positive $f_d$ frequencies | | Negative $f_d$ frequencies | |
|---|---|---|---|---|
| | lower | upper | lower | upper |
| Case 1 | | | | |
| $f_1 < \dfrac{f_{s_1}}{4}$ | $\dfrac{f_{s_1}}{4}\dfrac{U}{V} - f_1$ | $\dfrac{f_{s_1}}{4}\dfrac{U}{V} + f_1$ | $f_1 - \dfrac{f_{s_1}}{4}\dfrac{U}{V}$ | $-\dfrac{f_{s_1}}{4}\dfrac{U}{V} - f_1$ |
| Case 2 | | | | |
| $f_1 > \dfrac{f_{s_1}}{4}$ | $f_1 - \dfrac{f_{s_1}}{4}\dfrac{U}{V}$ | $\dfrac{3}{4}\dfrac{U}{V}f_{s_1} - f_1$ | $\dfrac{f_{s_1}}{4}\dfrac{U}{V} - f_1$ | $f_1 - \dfrac{3}{4}\dfrac{U}{V}f_{s_1}$ |

This table can be used for determining the decimation factor U/V, based on known factors such as the first frequency $f_1$, the first sampling rate $f_{s_1}$, and the desired frequency $f_d$. Although the second sampling rate $f_{s_2}$ may be arbitrary, a low sampling rate is preferable. The only constraint is that the second sampling rate $f_{s_2}$ satisfy the Nyquist criteria. This will usually not pose a problem, because sigma-delta converters generally operate at many times the operating frequency of the analog signal 202. However, if a low value of V is determined, it can readily be adjusted by multiplying the factor by a value that satisfies the Nyquist rate, as long as the variable U is multiplied by the same factor.

For example, let $f_{s_1}$=3.072 MHz, $f_1$=192 KHz and $f_d$=0 Hz (i.e., baseband). Solving for the factor U/V results in the equation $$\frac{U}{V} = \frac{4(f_d + f_1)}{f_{s_1}}.$$

Inserting the values in the above formula results in a U/V factor of ¼. This factor can be changed if desired by any factor of unity, e.g., 2/2. Hence, U/V could also equal 2/8. In this form, the decimator down-converts the first sampling rate $f_{s_1}$ by a factor of 8, and thereafter up-converts by a factor of 2. For a decimator factor of ¼, only down-conversion is used. However, a down-conversion factor of 8 (which satisfies the Nyquist rate) is preferable, because mixing operations may be performed at a lower speed than a ¼ decimator, thereby providing conservation of power.

FIG. 4 is an electrical block diagram detailing the elements of the transformation circuit 210 according to the present invention based on an illustration of a decimation factor set to ⅛. This decimation factor is based on an example substantially similar to the one described above with the exception that the first sampling rate $f_{s_1}$ is equal to 6.144 MHz. Also assume that a 56 tap FIR filter is desirable for the implementation of the filter circuit 302.

As previously described, the transformation circuit 210 comprises a rate conversion circuit 306, a filter circuit 302, and a digital mixer 310. The portions representative of these circuits are encapsulated by dashed rectangles in FIG. 4.

In this illustration, the rate conversion circuit 306 comprises a shift register 402, a FIFO (first-in-first-out) register file 406, and a 3 bit counter 415 operating at 6.144 MHz. These circuits are conventional circuits. The shift register 402 serves to segment the first digital signal 208 into a plurality of digital words 404 of predetermined length (8 bits) operating at the second sampling rate $f_{s_2}$. The combination of the shift register 402 and the FIFO register file 406 modifies the first sampling rate $f_{s_1}$ of the first digital signal 208 to the second sampling rate $f_{s_2}$ operating at ⅛ the first sampling rate $f_{s_1}$ (i.e., 768 KHz). The FIFO register file 406 stores seven eight bit digital words. These words in total comprise 56 bits of data 408, which is consistent with the data needed for a 56 tap FIR filter. The 3 bit counter 415 is used for cycling the seven digital words out of the FIFO register file 406 at a rate of 6.144 MHz, thereby generating a digital word signal 412 operating at that rate. It will be appreciated that other digital circuits suitable for the rate conversion circuit 306 may be used.

The filter circuit 302 is coupled to the digital word signal 412. The filter circuit 302 filters a selected one of the plurality of digital words in the digital word signal 412 with a predetermined transfer function to generate a filtered digital word. To accomplish this, the filter circuit 302 comprises two ROMs (read-only memories) 418, 420, a 3 bit counter 414 operating at 6.144 MHz, an adder 424, and an accumulator 427. To understand the implementation of the filter circuit 302, it is necessary to refer back to the FIR filter equation $$\sum_{k=0}^{N-1} h[k] \, S[((n-k))_N].$$

Since the digital words 412 generated by the FIFO register file 406 are of finite length, the filter circuit 302 can be implemented with a look-up circuit of pre-computed values determined for an N length FIR filter. In low power applications, this type of implementation is preferable to a conventional FIR filter that requires multiplication of coefficients with an input signal. The look-up circuit would contain pre-computed (length N multiply-accumulate) results stored in one or more memories (e.g., a ROM or RAM) or hard-coded into one or more digital decoders. In an application utilizing memories, each memory would include a plurality of predetermined filtered digital words of predetermined length corresponding to the predetermined transfer function.

Assuming, for example, that the look-up circuit is implemented with a memory, the memory would require $2^N$ words of ROM or RAM space to implement an N-tap FIR filter. In the present example, the FIR filter is a 56-tap filter. Consequently, the memory requirement would be too large and impractical for low power applications. To reduce the memory requirement, the associative property of linear filters is employed. By decomposing the equation described above into associative component units, the size of the overall memory is dramatically reduced. The following equation illustrates this principle $$\sum_{k_0=0}^{N_1-1} h[k_0] \, S[((n-k_0))_N] + \sum_{k_1=N_1}^{N_2-1} h[k_1] \, S[((n-k_1))_N] + \ldots \sum_{k_{m-1}=N_{m-1}}^{N-1} h[k_{m-1}] S[((n-k_{m-1}))_N].$$

This equation represents the decomposition of the prior equation into "m" FIR equations of equally sized taps. As a result, the ROM look up table is reduced to $m2^{N/m}$ words.

Recalling the example of FIG. 4 and letting m=14 for a 56-tap FIR filter, results in a total ROM size of 224 digital words. The 14 FIR equations each represent a 4-tap FIR filter. Each memory element of the ROM includes a pre-computed value corresponding to 1 of the 14 FIR equations computed for a predetermined digital word 404.

In the present example, a digital word signal 412 is 8 bits wide. To accommodate for the expansion of the 56-tap FIR filter into 14 FIR filters of 4-taps each, the digital word 404 is divided into two halves. Each half of the digital word signal 412 is coupled to a ROM having 112 pre-computed filtered words of 17 bits each. For each half of the digital word signal 412, 7 pre-computed values are read from each memory by the 3 bit counter 414 at a rate of 6.144 MHz. Hence, two pre-computed values are read simultaneously from each ROM 418, 420 and added together by the adder 424. After 7 additions of 2 pre-computed values, the effective result is the addition of 14 pre-computed values in conformance with the above equation. To accomplish these summations, the accumulator 427, comprising an adder-subtractor 426 and a feedback register 428 also operating at 6.144 MHz, is used to combine the 7 pairs of filtered digital words (i.e., pre-computed values) generated by the filter circuit 302 over a predetermined time interval (i.e., one cycle of 768 KHz). The resulting summation is representative of the construction of the modified and filtered first digital signal 308 operating at the second sampling rate (i.e., 768 KHz) and the first frequency.

After 14 pre-computed values have been summed together, the 3 bit counter 414 is reset in preparation for another digital word in the digital word signal 412. The resulting calculation of the filter circuit 302 (i.e., the modified and filtered first digital signal 308) is directed to the digital mixer 310 at a rate of 768 KHz.

Because the mixing frequency is set to one-quarter the second sampling rate, the digital mixer 310 does not need a multiplier circuit. Rather the operation of the digital mixer 310 is simplified to the operation of inserting a zero constant for either the I or Q signal. The negation of the modified and filtered first digital signal 308 is accomplished by selecting either a subtraction operation or a summation operation in the adder-subtractor 426 during the accumulation process of the 7 pairs of pre-computed values. The selection of either addition or subtraction depends on the value of the time constant n. Together these operations are consistent with multiplying the filtered result with the periodic sequence 1,j,−1,−j, . . .

To accomplish the mixing operation, the digital mixer 310 comprises a conventional demultiplexer 434 coupled to a zero constant 432. Depending on the value of the time constant n, the demultiplexer 434 is set to route the modified and filtered first digital signal 308 to the I or Q signal. The demultiplexer 434 is further set to route the zero constant 432 to the signal opposite the one selected for the modified and filtered first digital signal 308. Effectively these operations performed by the digital mixer 310 result in the mixing of the modified and filtered first digital signal 308 with the predetermined injection signal 312 to generate the second digital signal 214 operating at the second sampling rate and the desired frequency.

Figure 5:
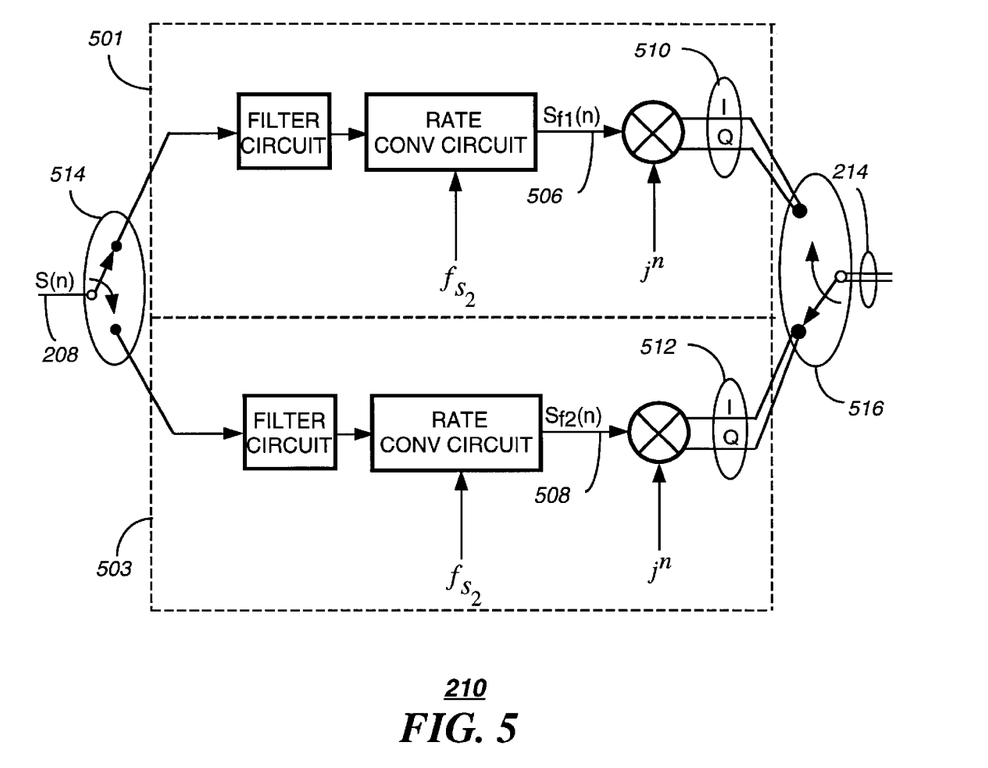
FIG. 5 is an electrical block diagram of an alternative embodiment of the transformation circuit according to the present invention based on an illustration of a decimation factor set to ⅔.

FIG. 5 is an electrical block diagram of an alternative embodiment of the transformation circuit 210 according to the present invention based on an illustration of a decimation factor set to ⅔. In this embodiment, the transformation circuit 210 comprises two sub-transformation circuits (501, 503), for frequency converting the first digital signal 208, sampled at a first sampling rate and operating at a first frequency, to the second digital signal 214 operating at the desired frequency. Each sub-transformation circuit comprises a rate conversion circuit, a filter circuit, and a digital mixer.

For a down-conversion of ⅛, each of the sub-transformation circuits 501, 503 is substantially similar to the elements shown in FIG. 4. In summary, each sub-transformation circuit 501, 503 is adapted to cause the rate conversion circuit to segment the first digital signal into a plurality of digital words of predetermined length operating at the second sampling rate. The filter circuit then filters a selected one of the plurality of digital words with a predetermined transfer function to generate a portion of the modified and filtered first digital signal 506 (or 508) operating at the second sampling rate and the first frequency. The digital mixer then mixes the portion of the modified and filtered first digital signal 506 (or 508) with the predetermined injection signal to generate a portion of the second digital signal 510 (or 512) operating at the second sampling rate and the desired frequency.

An input commutator 514 is used for providing the first digital signal 208 to the sub-transformation circuits 501, 503 at predetermined intervals. An output commutator 516 is used for combining portions of the second digital signal (510, 512) at predetermined intervals to generate the second digital signal 214 operating at the desired frequency and second sampling rate. The input and output commutators 514, 516 are conventional circuits implemented, for example, with a demultiplexer and multiplexer, respectively.

The critical difference between the transformation circuits of FIGS. 3 and 5 is that in FIG. 3 the up-conversion factor is U=1, whereas in FIG. 5 the up-conversion factor is U=2, thereby requiring two sub-duplicates of the transformation circuit 210. For factors of U greater than 2, a corresponding number of sub-transformation circuits is used. Another apparent difference is that the sub-transformation circuits 501, 503 operate on separate time constants (i.e., n1 and n2, respectively). In particular, the sub-transformation circuit 501 operates on an even time constant n1=0, 2, 4, . . . , while the sub-transformation circuit 503 operates on an odd time constant n2=1, 3, 5, . . . Alternatively, of course, the sub-transformation circuits 501, 503 could have operated with odd and even time constants, respectively. Note for higher factors of U, the time constants are distributed amongst the sub-transformation circuits accordingly.

Figure 6:
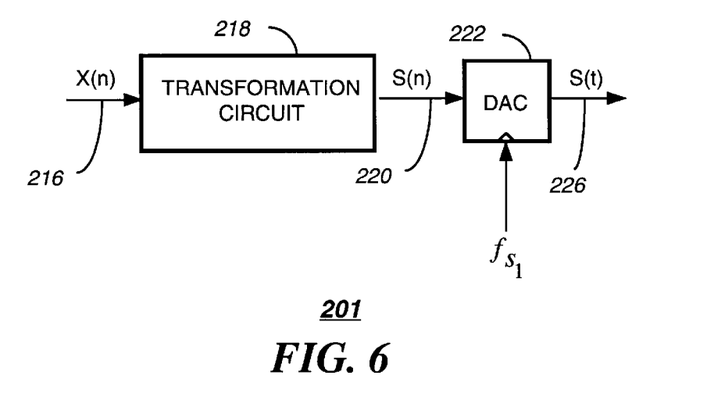
FIG. 6 is an electrical block diagram of an up-conversion mixer according to the present invention.

FIG. 6 is an electrical block diagram of an up-conversion mixer 201 according to the present invention. The up-conversion mixer 201 comprises a transformation circuit 218 and a DAC (digital-to-analog converter) 222. The transformation circuit 218 receives a first digital signal 216 (denoted by the symbol x(n)) operating at, for example, a first frequency $f_1$ of, e.g., zero Hz (i.e., baseband), and converts it to a second digital signal 220 (denoted by the symbol S(n)) operating at a desired frequency $f_d$ and first sampling rate $f_{s_1}$. The DAC 222 thereafter converts second digital signal 220 into an analog output signal 226 operating at the desired frequency. Because of the symmetry present in the transformation circuit 210 of FIGS. 3 and 5, the transformation circuit 218 may be implemented with substantially the same circuits of the transformation circuit 210 with minor alterations to the Table 1 for determining the decimation factor U/V.

Figure 7:
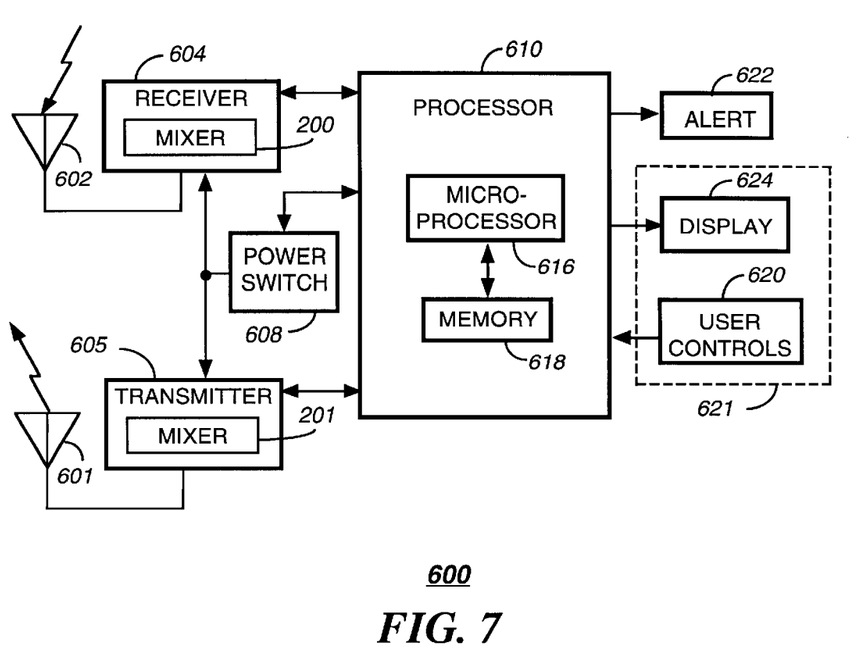
FIG. 7 is an electrical block diagram of one of a number of embodiments of a selective call unit utilizing the mixers of FIGS. 2 and 6 according to the present invention.

FIG. 7 is an electrical block diagram of one of a number of embodiments of an SCU (selective call unit) 600 according to the present invention. The SCU 600 comprises a receiver 604 and a transmitter 605, each including the mixers 200, 201 described above, respectively. The receiver 604 and the transmitter 605 are coupled to conventional antennas 602, 601, a power switch 608, and a processor 610, which is coupled to a user interface 621.

The receiver 604 and antenna 602 are utilized for receiving radio signals that include messages transmitted by a radio communication system. The receiver 604 generates digital data after down-converting the radio signals to baseband in accordance with the present invention. The digital data is then processed by the processor 610. The transmitter 605 and antenna 601 convert a response message generated by the processor 610 at baseband to a radio signal utilizing the mixer 201 according to the present invention. The radio signal is then transmitted to the radio communication system.

The power switch 608 is a conventional switch, such as a MOS (metal oxide semiconductor) switch for controlling power to the receiver and transmitter 604, 605 under the direction of the processor 610, thereby providing a battery saving function.

The processor 610 is used for controlling operation of the SCU 600. Generally, its primary function is to decode and process demodulated messages provided by the receiver 604, responding to such messages by way of the transmitter 605, storing the messages and alerting a user of the received message. To perform this function, the processor 610 comprises a conventional microprocessor 616 coupled to a conventional memory 618 having nonvolatile and volatile memory portions, such as a ROM (read-only memory) and RAM (random-access memory). One of the uses of the memory 618 is for storing messages received from the radio communication system. Another use is for storing one or more selective call addresses utilized in identifying incoming personal or group messages to be intercepted by the SCU 600.

Once a message has been decoded and stored in the memory 618, the processor 610 activates the alerting device 622 (included in the user interface 621) which generates a tactile and/or audible alert signal to the user. The user interface 621, which further includes, for example, a conventional LCD display 624 and conventional user controls 620, is utilized by the user for processing the received messages. This interface provides options such as reading, deleting, and locking of messages.

To communicate messages to the SCU's 600, the radio communication system preferably utilizes a protocol such as the FLEX protocol, developed by Motorola, Inc. (FLEX is a trademark of Motorola, Inc.) for transmitting synchronous messages. The FLEX protocol is a digital selective call signaling protocol that is presently used by various system operators in the United States and in several other countries. It will be appreciated that, alternatively, other signaling protocols that are suitable to the present invention can be used.

As is apparent from the discussions above, the mixers 200, 201 provide several advantages not present in prior art systems described in FIG. 1. An essential feature of both mixers 200, 201 is that each mixer can convert any digital signal to an arbitrary desired frequency independent of the sampling rate of an ADC or DAC. This aspect of the present invention provides substantial improvements over the prior art. In particular, the present invention allows for multiplierless conversion of digital signals to any arbitrary desired frequency. Prior art systems provide a multiplierless frequency conversion constrained to a conversion frequency dictated by the operating rate of an ADC or DAC. Because of this constraint, the scope of application for prior art systems is substantially limited.

In sum, the present invention provides for conversion mixers 200, 201 that allow for frequency conversion of digital signals in a multiplierless fashion, at low power, and converted to any arbitrary desired frequency independent of the sampling rate of an ADC or DAC.

Although the invention has been described in terms of a preferred embodiment it will be obvious to those skilled in the art that many alterations and variations may be made without departing from the invention. Accordingly, it is intended that all such alterations and variations be considered as within the spirit and scope of the invention as defined by the appended claims.

What is claimed is:

1. A method for frequency converting a first digital signal, sampled at a first sampling rate and operating at a first frequency, to a second digital signal operating at a desired frequency, comprising the steps of:
  modifying and filtering the first digital signal to eliminate unwanted frequencies in the first digital signal and to alter the first sampling rate of the first digital signal by a predetermined factor to generate a modified and filtered first digital signal sampled at a second sampling rate and operating at the first frequency, wherein the step of modifying and filtering comprises the steps of:
    segmenting the first digital signal into a plurality of digital words of predetermined length,
    filtering a selected one of the plurality of digital words with a predetermined transfer function to generate a filtered digital word, and
    combining a plurality of filtered digital words generated over a predetermined time interval to construct the modified and filtered first digital signal sampled at the second sampling rate and operating at the first frequency;
  and
  mixing the modified and filtered first digital signal with a predetermined injection signal to generate the second digital signal sampled at the second sampling rate and operating at the desired frequency.

2. A method for frequency converting a first digital signal, sampled at a first sampling rate and operating at a first frequency, to a second digital signal operating at a desired frequency, comprising the steps of:
  delaying the first digital signal by a plurality of predetermined time offsets, thereby generating a plurality of delayed first digital signals;
  processing each of the plurality of delayed first digital signals to generate a plurality of delayed portions of a modified and filtered first digital signal, each of the plurality of delayed portions sampled at a second sampling rate and operating at the first frequency, wherein a selected one of the plurality of delayed first digital signals is processed by:
    segmenting the selected one of the plurality of delayed first digital signals into a plurality of digital words of predetermined length,
    filtering a selected one of the plurality of digital words with a predetermined transfer function to generate a corresponding one of the plurality of delayed portions of the modified and filtered first digital signal;
  mixing each of the plurality of delayed portions of the modified and filtered first digital signal with a predetermined injection signal to generate a plurality of delayed portions of the second digital signal sampled at the second sampling rate and operating at the desired frequency; and
  combining the plurality of delayed portions of the second digital signal to generate the second digital signal sampled at the second sampling rate and operating at the desired frequency.

3. A mixer, comprising:
  a transformation circuit for frequency converting a first digital signal, sampled at a first sampling rate and operating at a first frequency, to a second digital signal operating at a desired frequency,
  wherein the transformation circuit modifies and filters the first digital signal to eliminate unwanted frequencies in the first digital signal and alters the first sampling rate of the first digital signal by a predetermined factor to generate a modified and filtered first digital signal sampled at a second sampling rate and operates at the first frequency; and
  mixes the modified and filtered first digital signal with a predetermined injection signal to generate the second digital signal sampled at the second sampling rate and operates at the desired frequency;
  the transformation circuit comprising:
    a rate conversion circuit;
    a filter circuit; and
    a digital mixer,
  wherein the transformation circuit is adapted to:
    cause the rate conversion circuit to segment the first digital signal into a plurality of digital words of predetermined length sampled at the second sampling rate,
    cause the filter circuit to filter a selected one of the plurality of digital words with a predetermined transfer function to generate the modified and filtered first digital signal sampled at the second sampling rate and operating at the first frequency, and
    cause the digital mixer to mix the modified and filtered first digital signal with the predetermined injection signal to generate the second digital signal sampled at the second sampling rate and operating at the desired frequency.

4. The mixer as recited in claim 3, further comprising an ADC (analog-to-digital converter) for converting an analog signal operating at the first frequency into the first digital signal sampled at the first sampling rate.

5. The mixer as recited in claim 4, wherein the ADC is a sigma-delta converter.

6. The mixer as recited in claim 3, further comprising a DAC (digital-to-analog converter) for converting the second digital signal sampled at the second sampling rate and operating at the desired frequency into an analog signal operating at the desired frequency.

7. The mixer as recited in claim 6, wherein the DAC is a sigma-delta converter.

8. The mixer as recited in claim 3, wherein the filter circuit comprises at least one memory, wherein the at least one memory includes a plurality of predetermined filtered digital words of predetermined length corresponding to the predetermined transfer function.

9. A selective call unit comprising the mixer of claim 3.

10. The selective call unit as recited in claim 9, wherein the mixer is an up-conversion mixer.

11. The selective call unit as recited in claim 9, wherein the mixer is a down-conversion mixer.

12. A transformation circuit, comprising:
a plurality of sub-transformation circuits, for frequency converting a first digital signal, sampled at a first sampling rate and operating at a first frequency, to a second digital signal operating at a desired frequency, each sub-transformation circuit comprising:
   a rate conversion circuit,
   a filter circuit, and
   a digital mixer,
   wherein each sub-transformation circuit is adapted to:
      cause the rate conversion circuit to segment the first digital signal into a plurality of digital words of predetermined length sampled at a second sampling rate,
      cause the filter circuit to filter a selected one of the plurality of digital words with a predetermined transfer function to generate a portion of a modified and filtered first digital signal sampled at the second sampling rate and operating at the first frequency, and
      cause the digital mixer to mix the portion of the modified and filtered first digital signal with a predetermined injection signal to generate a portion of the second digital signal sampled at the second sampling rate and operating at the desired frequency;
an input commutator for providing the first digital signal to the plurality of sub-transformation circuits at predetermined intervals; and
an output commutator for combining portions of the second digital signal at predetermined intervals to generate the second digital signal sampled at the second sampling rate and operating at the desired frequency.

13. The transformation circuit as recited in claim 12, wherein the filter circuit comprises at least one digital decoder.

14. The transformation circuit as recited in claim 12, wherein the filter circuit comprises at least one memory, wherein the at least one memory includes a plurality of predetermined filtered digital words of predetermined length corresponding to the predetermined transfer function.

* * * * *